United States Patent
Yang et al.

(10) Patent No.: US 6,483,130 B1
(45) Date of Patent: Nov. 19, 2002

(54) BACK-ILLUMINATED HETEROJUNCTION PHOTODIODE

(75) Inventors: Wei X. Yang, Minnetonka, MN (US); Thomas E. Nohava, Apple Valley, MN (US); Scott A. McPherson, Eagan, MN (US); Robert C. Torreano, Coon Rapids, MN (US); Subash Krishnankutty, Minneapolis, MN (US); Holly A. Marsh, St. Louis Park, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/275,632

(22) Filed: Mar. 24, 1999

(51) Int. Cl.[7] ........................................... H01L 31/0304
(52) U.S. Cl. ..................... 257/189; 257/184; 257/201; 257/458
(58) Field of Search ................................ 257/184, 189, 257/201, 458

(56) References Cited

U.S. PATENT DOCUMENTS

| | | | |
|---|---|---|---|
| 4,614,961 A | | 9/1986 | Khan et al. |
| 5,146,465 A | | 9/1992 | Khan et al. |
| 5,278,435 A | * | 1/1994 | Van Hove ................... 257/184 |
| 5,677,538 A | | 10/1997 | Moustakas et al. |
| 5,679,965 A | | 10/1997 | Schetzina |
| 5,739,554 A | | 4/1998 | Edmond et al. |
| 5,834,331 A | | 11/1998 | Razeghi |
| 5,847,397 A | | 12/1998 | Moustakas |
| 5,900,650 A | * | 5/1999 | Nitta ........................... 257/96 |

FOREIGN PATENT DOCUMENTS

| | | |
|---|---|---|
| EP | 0177918 A | 4/1986 |
| JP | 05095130 | 4/1993 |
| JP | 07288334 | 10/1995 |
| WO | 9326049 A | 12/1993 |

OTHER PUBLICATIONS

Sze "Physics of Semiconductor Devices" pp. 763–765 John Wiley & Sons N.Y. 1982.*
Article: "Back–Immunimated GaN/AlGaN heterojunction photodiodes with high quantum efficiency and low noise", Wei Yang, et al. 1998 American Institute of Physics, accepted for publication Jun. 11, 1998. pp. 1086–1088.
Yang W et al: "Back–Illuminated GaN/AlGaN Heterojunction Photodiodes With High Quantum Efficiency and Low Noise" Applied Physics Letters, vol. 73, No. 8, Aug. 24, 1998, pp. 1086–1088, XP000777678.
Patent Abstracts of Japan, vol. 016, No. 048 (E–1163), Feb. 6, 1992 and JP 03 252172 A (Sanyo Electric Co Ltd), Nov. 11, 1991 Abstract.
Brown J et al: "Visible–Blind UV Digital Camera Based on a 32*32 Array of GaN/AlGaN P–I–N Photodiodes", Mrs Internet Journal of Nitride Semiconductor Research, vol. 4S1, Sep. 1999, XP000949328 ISSN: 1092–5783.

* cited by examiner

*Primary Examiner*—Jerome Jackson
(74) *Attorney, Agent, or Firm*—Kris T. Frederick

(57) ABSTRACT

A p-i-n photodiode having a high responsivity and quantum efficiency due to an AlGaN heterojunction where photons are absorbed within the p-n junction thereby eliminating carrier losses due to surface recombination and diffusion processes. Ultraviolet light comes through a transparent substrate, such as sapphire, a transparent AlN buffer and an n-doped AlGaN layer, and to an undoped AlGaN layer where the light is absorbed. The undoped layer is sandwiched between the n-doped AlGaN layer and a p-doped AlGaN layer. Metal contacts are formed on the doped layers to obtain the current caused by the absorbed light in the undoped layer. The mole fractions of the Al and Ga in the undoped and doped layers may be adjusted to obtain a desired wavelength bandpass of light to be detected.

32 Claims, 4 Drawing Sheets

BACK-ILLUMINATED HETEROJUNCTION PHOTODIODE

The Government may have rights in this invention pursuant to Contract No. F33615-95-C-1618, awarded by the Department of the Air Force.

BACKGROUND

The invention pertains to photo detectors, and particularly to ultraviolet (UV) light photo detectors. More particularly, the invention pertains to back-illuminated UV photo detectors.

In the art, there have been several GaN-based p-n and p-i-n junction UV photodiodes. Here, the photovoltaic (zero bias) responsivities have been typically in the range of 0.1–0.12 ampere per watt (A/W), corresponding to external quantum efficiencies (i.e., collected electron-hole pairs per photon) of 30 to 40 percent. Under reverse bias, there has been 0.15 A/W or a 50-percent quantum efficiency at 364 nanometers (nm). These results indicate that even excluding the reflection loss on the GaN surface (minus 20 percent), there is still a considerable internal loss in these detectors. One common feature of these photodiodes is that the light enters into the detector through a 0.2 to 0.3 micron top p-GaN layer, in which most of the absorption and photogeneration take place near the p-GaN surface. This renders a diffusion-limited photocurrent and possibly substantial carrier loss due to surface recombination. The situation worsens at shorter wavelengths due to stronger absorption near the surface. Such homojunction photodiodes have been modeled and estimated to have a maximum responsivity of 0.13 A/W at 362 nm, or a quantum efficiency of 45 percent at zero bias. Under reverse bias, the responsivity is expected to be higher due to field assisted diffusion, but this generally leads to leakage current and associated shot noises.

Improvement in efficiency can be obtained by reducing the p-GaN top layer thickness. But overly thinning the p-GaN layer results in large RC delay due to the poor conductivity of the p-GaN. On the other hand, using p-AlGaN as the top electrode results in junction degradation due to the lower quality of p-AlGaN. This represents a bigger challenge for higher Al mole fractions. Schottky type photodiodes have shown higher responsivity because the carriers are generated within the junction and are collected rather efficiently. A responsivity of about 0.18 A/W on n-GaN Schottky photodiodes under a minus five-volt bias, has been noted. However, the leakage current in these diodes was several orders of magnitude higher than p-n or p-i-n junction type photodiodes. The Schottky photodiodes also have the drawback of light absorption by the metal contact.

SUMMARY OF THE INVENTION

The present invention is a photo detector or photodiode that provides high efficiency in the detection of UV light. It is an aluminum gallium nitride (AlGaN) based ultra-violet photodiode that has application in flame sensing and other ultraviolet detection uses. Light comes into the detector from the substrate side, contrary to typical detectors. In other words, it is a back-illuminated GaN/AlGaN ultraviolet (UV) heterojunction photodiode with a high quantum efficiency. A photovoltaic (zero bias) responsivity (which correlates to a quantum efficiency) of 0.2 A/W at 355 nm was achieved. This responsivity or efficiency is higher than all previously reported AlGaN and SiC based photodiodes. The present device can be operated under zero bias (photovoltaic mode) or reverse bias depending on the specific applications. The improved efficiency primarily arises from the use of an AlGaN/GaN heterojunction in which photons are absorbed within the p-n junction thus eliminates carrier losses due to surface recombination and diffusion processes in previously reported homojunction devices. Dark impedance and a visible rejection ratio much higher than typical photo conductors or detectors were obtained.

The heterojunction UV detection diode is based on a p-i-n structure. The structure consists of four AlGaN layers deposited on sapphire substrate. The layers include an AlN buffer layer, an n-type $Al_xGa_{(1-x)}N$ layer, an undoped $Al_yGa_{(1-y)}N$ absorption layer and a p-type $Al_zGa_{(1-z)}N$ layer. The undoped i-type $Al_yGa_{1-y}N$ absorption layer is interposed between the p-type $Al_zGa_{1-z}N$ layer and the n-type $Al_xGa_{1-x}N$ layer. The bandpass wavelength selectivity can be adjusted by varying the Al mole fractions in the n-type $Al_xGa_{1-x}N$ layer and the undoped $Al_yGa_{1-y}N$ absorption layer. The ranges of the mole fractions are: $0<x<0.5$, $0 \leq y<0.5$, $0 \leq z<0.5$, $x>y$, and $z \geq y$. In this configuration, the spectral range of detection is determined by the absorption edges of the n-type $Al_xGa_{(1-x)}N$ layer and the undoped $Al_yGa_{(1-y)}N$ absorption layer. For example, when x=0.4 and y=z=0 are used, the detector is sensitive in the 275 nm to 365 nm spectral range, suitable for flame sensing in most boilers and turbines. The UV light in the detection range enters from the sapphire side and essentially is absorbed only by the undoped $Al_yGa_{(1-y)}N$ layer. This ensures that most photogenerated carriers are within the p-n junction region and are collected efficiently.

In sum, a GaN/AlGaN UV photodiode with a very high quantum efficiency is disclosed, with a photovoltaic (zero bias) responsivity of at least 0.2 A/W at a 355-nm wavelength. This improvement is primarily attributed to the use of an AlGaN/GaN heterojunction in which photons are absorbed within the p-n junction and away from the surface and thus carrier loss due to surface recombination and diffusion processes are eliminated. Very high dark impedance and a large visible rejection ratio can be obtained. These results indicate a high quality GaN/AlGaN interface and efficient photocarrier collection in the photodiode and represent a significant improvement over related art GaN-based homojunction photodiodes.

Prior to this invention, AlGaN and SiC based solid state UV detectors included photoconductors and various photodiodes of both Schottky and p-n junction types. Each of these photoconductors has simplicity but is known to have a very slow response due to persistent photoconductivity (PPC). It also exhibits substantial dark current which drifts in a large magnitude over required operating temperature ranges (e.g. from minus 40 to plus 120 degrees C.), rendering it unsuitable for DC mode detection. In addition, the photoconductive characteristics are difficult to reproduce due to its reliance on defect related effects in AlGaN, which imposes further limitations to such photoconductor as a viable product. The present photodiode does not have PPC and drift problems, and can be used in both DC and AC detection modes. It also has excellent reproducibility.

In contrast to AlGaN based Schottky photodiodes, the present photodiode provides much lower leakage current and smaller temperature dependence, and thus is more suitable for applications requiring wide operating temperature ranges and high sensitivities.

In comparison to conventional AlGaN and SiC based p-n junction photodiodes, the present photodiode provides higher responsivity due to the use of heterojunctions and back illumination. In related art AlGaN and SiC homojunction devices, carrier losses arise from surface recombination and diffusion process because most carriers are generated near the surface. In the present device, the photons are absorbed within the p-n junction and therefore the photo-generated carriers are collected efficiently. In addition, the sapphire-air and sapphire-AlGaN interfaces give a total reflection of about 12 percent, compared with about 20 percent reflection directly on AlGaN surface.

The improvement over SiC based devices also includes a sharper long wavelength cutoff due to the direct band gap of AlGaN, and a tunable band-pass wavelength selectivity, which can be achieved by adjusting the Al mole fractions in the n-type $Al_xGa_{(1-x)}N$ layer and the undoped $Al_yGa_{(1-y)}N$ layer. Thus, the present device can be fabricated for the detection of a specific narrow band of UV wavelengths without using external filters.

DESCRIPTION OF THE EMBODIMENT

Figure 1:
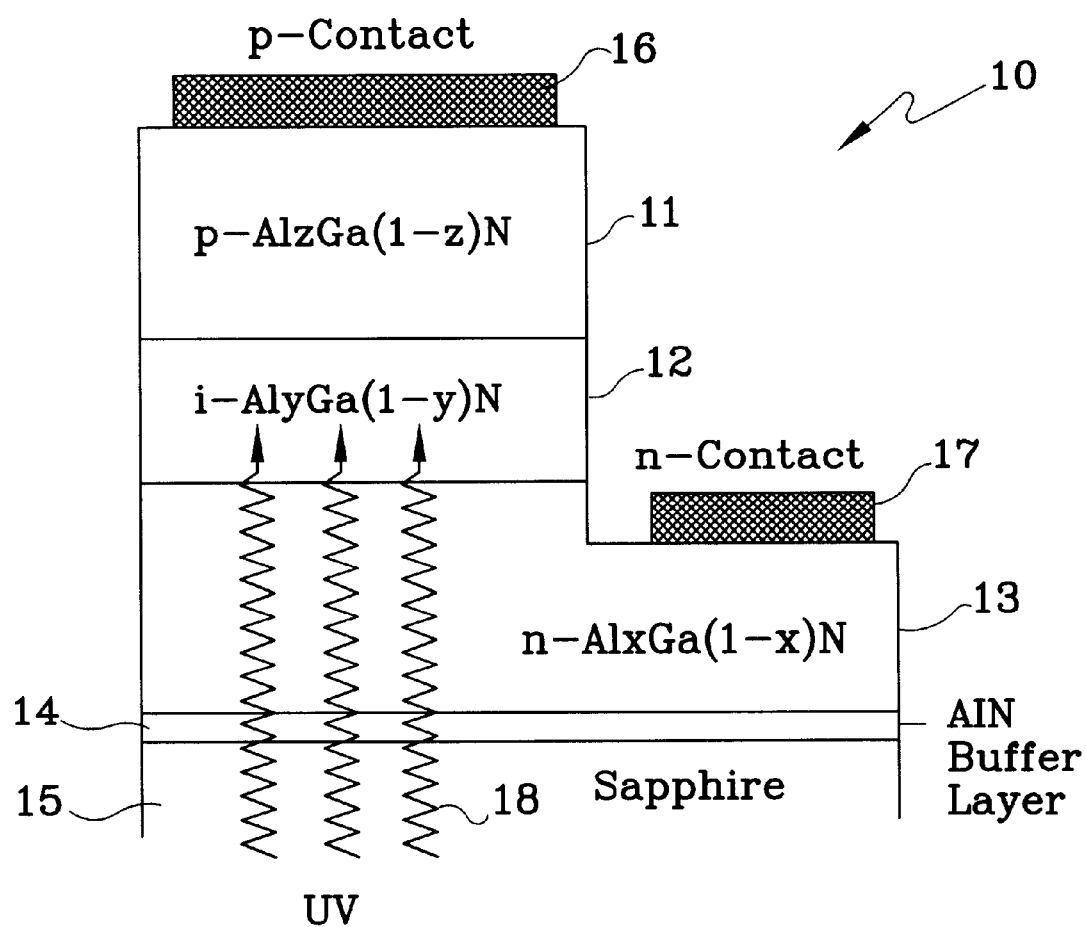
FIG. 1 is a sectional view of the back-illuminated diode.

FIG. 1 is a cross-sectional view of a photo detector embodiment 10 of the present invention. On a sapphire substrate 15 is formed an aluminum nitride (AlN) buffer layer 14. The thickness of a substrate 15 is about 380 microns (15 mils) but may be another thickness, typically, between 200 and 500 microns (8 and 20 mils). The substrate starts out being part of a five-centimeter (two-inch) diameter wafer. The photo detector chip is cut at a size of 1.5 by 1.5 millimeter (mm) square. However, another convenient size is 0.3 mm by 0.3 mm. Sapphire is preferred because of its transparent characteristics to most of the UV wavelengths of interest. Materials such as silicon carbide are not transparent to all the of UV wavelengths, such as those less than 320 nanometers (nm). Buffer layer 14 is 25 nm (250 angstroms) thick but could have a thickness between 10 and 50 nm. Buffer layer 14 is for growing subsequent layer 13. This layer 14 is transparent to the entire UV spectrum.

Formed on layer 14 is an n-type aluminum gallium nitride (n-$Al_xGa_{(1-x)}N$) electrode layer 13. Layer 13 is transparent to the UV spectrum and yet is electrically conductive. A p-type layer is difficult to make both conductive and transparent to UV light. Layer 13 is silicon (Si) doped with $10^{17}$ to $10^{19}$ atoms per cubic centimeter (cm). This layer 13 is about 1.5 microns thick but could have a thickness set between 0.25 and 20 microns.

Formed on layer 13 is an aluminum gallium nitride (i-$Al_yGa_{(1-y)}N$) absorption layer 12, which is not doped. This layer 12 has a built-in electric field (even without a bias) wherein the negative and positive carriers are separated as soon as they are generated, and thus gives rise to a high-level field assisted collection of carriers. Layer 12 provides high internal efficiency in that virtually all of the holes and electrons generated in this layer contribute to the current measured. A loss of carriers reduces current. UV light 18 enters from the bottom side of substrate 15 and passes up through layer 13 and is absorbed by layer 12. The absorption by layer 12 eliminates the diffusion limited carrier transport (i.e., current) and thus results in efficient carrier collection. Since photo generation takes place apart from the surface at the interface of layers 12 and 13, and the interface of layer 13 and substrate 15, surface recombination is significantly reduced or actually avoided. Layer 12 is about 0.25 micron; however, a selected thickness may be between 0.1 and 5 microns.

Formed on layer 12 is a p-type aluminum gallium nitride (p-$Al_zGa_{(1-z)}N$) electrode layer 11. Layer 11 is doped with magnesium (Mg) at a density of $10^{17}$ to $10^{20}$ atoms per cubic cm. Layer 11 is about 0.5 micron thick but could have a thickness between 0.1 and 2 microns.

Layers 11 and 12 are etched on one side partially down into layer 13 to a fraction of a micron. An n-contact 17 is formed on the etched portion of layer 13. The first layer of contact 17 formed on layer 13 is about 50 nm of titanium (Ti). About 0.5 micron of aluminum is formed on the Ti. The aluminum layer may be up to several microns thick. On top of layer 11 is formed a p-contact 16. First, a layer of nickel is formed on layer 11. The thickness of the nickel may be between 10 and 500 nm. To complete contact 16, a layer of gold, having a thickness between 0.5 and 2 microns is formed on the nickel. The gold and nickel of contacts 16 and 17, respectively, are for bonding good electrical connections to photodiode 10.

The composition portions of Al and Ga for layers 11, 12 and 13 are indicated by z, y and x, respectively. There is an interrelationship of portions among these three layers. For instance, z is greater or equal to y, because if z<y then absorption would occur in layer 11. Also, x>y because if x≦y then the band pass of UV would be effectively eliminated by the absorption of layer 13 in that current would not be generated.

Figure 2:
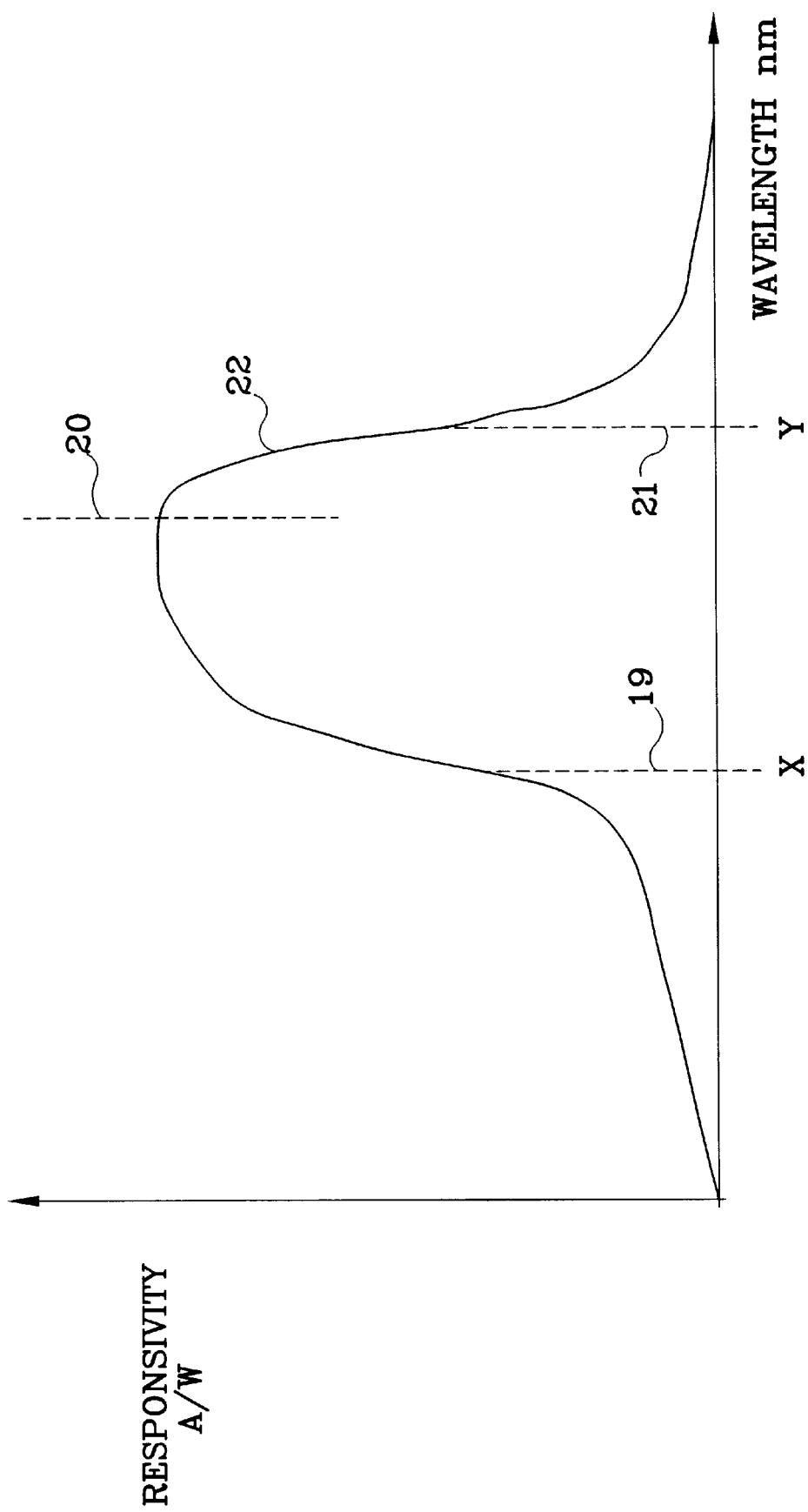
FIG. 2 is a graph of the responsivity versus wavelength of the diode.

FIG. 2 shows a graph of responsivity or efficiency in ampere per watt versus wavelength of detector UV light. The graph effectively shows the band pass 22 characteristic of photo detector 10. The band pass can be customized by independently varying the x and y portions (i.e., the mole fractions). A lower boundary 19 of band pass 22 decreases in wavelength for increased x. Boundary 19 can get down to about 290 nm. An upper boundary 21 of band pass 22 decreases in wavelength for increased y. If y=0, then boundary 21 is at about 360 nm. Center frequency line 20 of band pass 22 is set with boundaries' 19 and 21 adjustments according to the light to be detected and/or monitored. For flame detection of combustion of hydrocarbon fuels, the center frequency line would be set at about 310 nm.

For instance, let electrode layer 13 have an Al mole fraction of 28 percent and a thickness of about 1.5 microns. The undoped GaN absorbing layer 12 is about 0.2 micron thick and top p-GaN layer 11 is about 0.7 micron thick. N-$Al_{0.28}Ga_{0.72}N$ layer 13 introduces a short wavelength cutoff at its absorption edge of 295 nm. This combined with the 365 nm long wavelength cutoff of i-GaN gives a band pass spectral response between 295 and 365 nm. The cutoff wavelengths on both sides of the band can be modified by changing the Al mole fractions in bottom AlGaN layer 13 and absorbing layer 12. The conductivity of bottom n-AlGaN layer 13 can be maintained for an Al mole fraction as high as 45 percent, or an UV wavelength as short as 265 nm. Sapphire substrate 15 is transparent in the UV spectral range of interest (i.e., from 200 to 365 nm) and is mechanically and chemically robust, and therefore serves as an ideal window for the detector. The sapphire's lower index of refraction, 1.8 at 360 nm, compared to about 2.7 for GaN, results in a reduction in reflection loss, which, counting all the reflections at the air-sapphire, sapphire-AlGaN, and AlGaN-GaN interfaces, is about 12 percent, compared to about 20 percent on GaN.

The structure of diode 10 was grown on a 5 centimeter c-plane sapphire wafer 15 in a low-pressure (10 Torr) metalorganic chemical vapor deposition (MOCVD) reactor using triethylgallium (TEG), triethylaluminum (TEA), and ammonia ($NH_3$) precursors. The growth was initiated by depositing a thin AlN buffer layer 14 at 625 degrees C., and all subsequent layers were grown at 1050 degrees C. Photodiode 10 was fabricated by mesa etching followed by n-type and p-type metal contacts 17 and 16, respectively. A 10 mT $BCl_3+Cl_2$ reactive ion etching (RIE), a 0.5-micron plasma enhanced chemical vapor deposition (PECVD) $SiO_2$ mask, and a typical 180 nm per minute etch were used. The Ti/Al (50 nm/500 nm) was used for n-type contact 17 and the Ni/Au (20 nm/500 nm) was used for p-type contact 16. Wafer 15 was annealed at 700 degrees C. for 30 seconds in a rapid thermal annealer.

Figure 3:
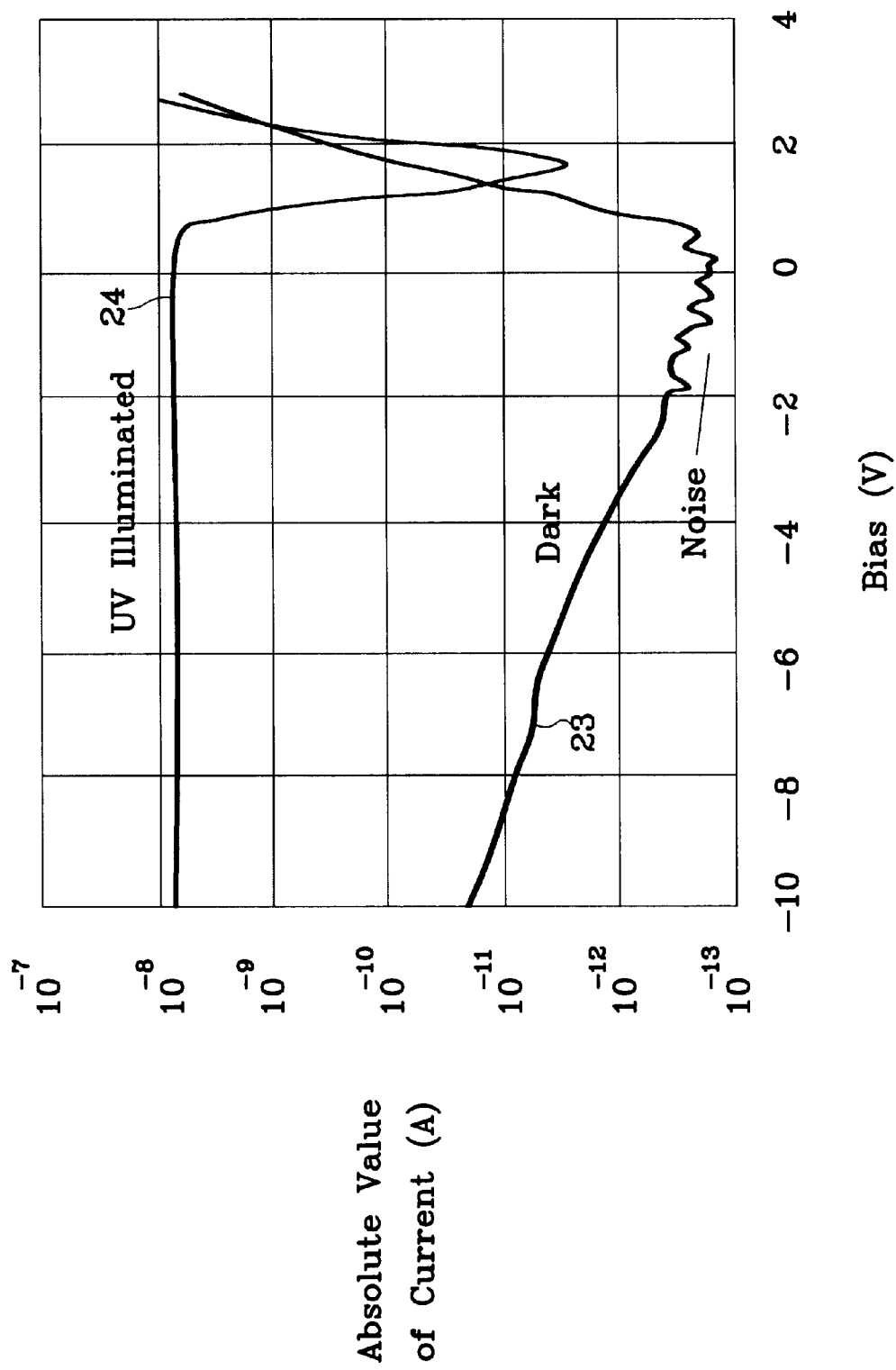
FIG. 3 is a graph of I–V characteristics of a GaN/AlGaN heterojunction photodiode.

In FIG. 3, the dark and UV illuminated I–V (current-voltage) characteristics (shown by curves 23 and 24 for a GaN/AlGaN heterojunction photodiode of a 250-micron mesa diameter are shown. The reverse bias current in the dark is about 2.5 picoamperes (pA) at minus five volts and less than 0.5 pA at minus 2 volts. From zero to minus one volt, the leakage was not measurable and a dark impedance in excess of $10^{13}$ ohms at zero volts was estimated. Dark current 23 rises exponentially with the reverse bias and is about 19 pA at minus ten volts. Under 355-nm UV illumination at an intensity of 70 microwatts per square centimeter, photocurrent 24 remains fairly flat from zero to minus ten volts.

Figure 4:
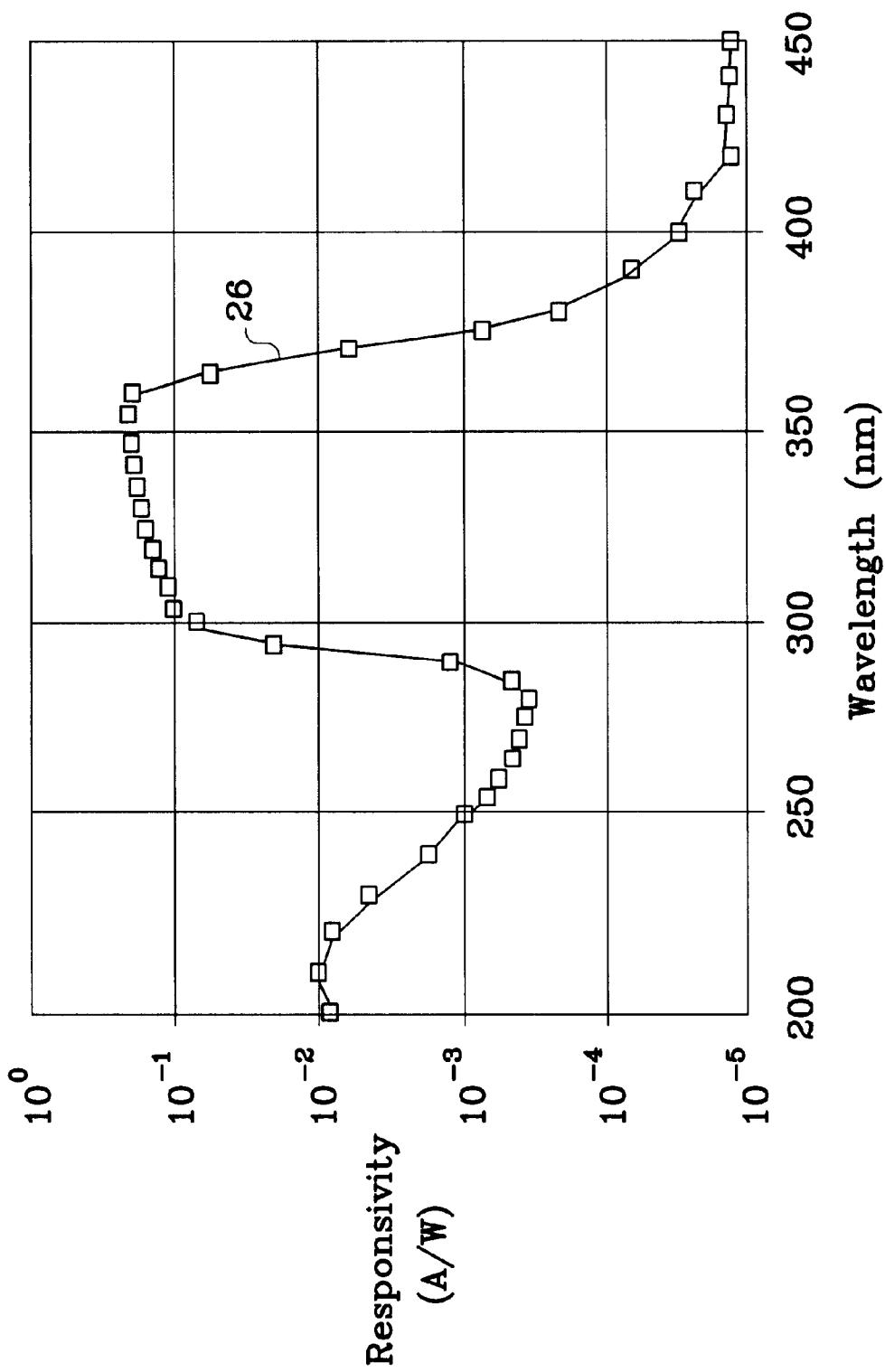
FIG. 4 shows an actual spectral response of the photodiode having particular mole fractions for respective layers.

The UV source used for the spectral responsivity measurement was a xenon lamp and the wavelengths were selected by a monochromater. The light source was calibrated by a calibrated UV enhanced Si photodetector. The photovoltaic responsivity (at zero volts) versus wavelengths was plotted as shown by curve 26 in FIG. 4. FIG. 4 shows spectral response 26 of the GaN/AlGaN photodiode. The diode has a long wavelength cutoff at 365 nm, and a short wavelength cutoff at 295 nm due to the n-$Al_{0.28}Ga_{0.72}N$ layer absorption. The long wavelength cutoff corresponds to the fundamental absorption edge of GaN. Four orders of magnitude drop in responsivity were observed from 350 to 400 nm, and above 450 nm the response was not measurable.

A peak responsivity of 0.2 A/W was obtained at 355 nm at zero bias, which corresponds to a 70-percent external quantum efficiency. Excluding the 12-percent reflection loss at the sapphire surface and sapphire-AlGaN interfaces, the internal quantum efficiency is estimated to be about 82 percent. Under a reverse bias of minus 12 volts, the responsivity increases slightly to 0.22 A/W, which corresponds to a 78-percent percent external quantum efficiency and a 90-percent internal quantum efficiency. These results represent the highest efficiencies achieved in GaN-based UV photodiodes due to the use of GaN/AlGaN heterojunctions.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A back-illuminated heterojunction photodiode for detecting an incoming light beam, comprising:
a substrate, the substrate being substantially transparent to the incoming light beam;
a first electrode layer formed above said substrate, said first electrode layer being substantially transparent to the incoming light beam and conductive;
an absorption layer formed above said first electrode layer;
a second electrode layer formed adjacent said absorption layer with no intervening current confining clad layer, said second electrode layer being conductive; and
a metal contact layer forming a substantially ohmic contact with the second electrode layer.

2. The photodiode of claim 1, wherein:
said first electrode layer is n-doped;
said absorption layer is undoped; and
said second electrode layer is p-doped.

3. The photodiode of claim 2, wherein the incoming light beam to be detected enters said substrate and some of the light propagates through said first electrode layer to said absorption layer.

4. The photodiode of claim 3, the light is of an ultraviolet wavelength.

5. The photodiode of claim 4, further comprising a buffer layer situated between said substrate and said first electrode layer.

6. The photodiode of claim 5, wherein said first and second electrode layers and said absorption layer comprise AlGaN.

7. The photodiode of claim 6, wherein said buffer layer comprises AlN.

8. The photodiode of claim 7, wherein said substrate comprises sapphire.

9. The photodiode of claim 8, wherein:
said first electrode layer comprises $Al_xGa_{(1-x)}N$;
said absorption layer comprises $Al_yGa_{(1-y)}N$; and
said second electrode layer comprises $Al_zGa_{(1-z)}N$.

10. The photodiode of claim 9, wherein:
$z \geq y$; and
$x > Y$.

11. The photodiode of claim 10, wherein x<50 percent.

12. The photodiode of claim 11, wherein:
said buffer layer has a thickness between 10 and 100 nm;
said first electrode layer has a thickness between 0.25 and 20 microns;
said absorption layer has a thickness between 0.1 and 5 microns; and
said second electrode layer has a thickness between 0.1 and 2 microns.

13. The photodiode of claim 12, wherein:
said first electrode layer is silicon-doped with $10^{17}$ to $10^{19}$ atoms per cubic centimeter; and
said second electrode layer is magnesium-doped with $10^{17}$ to $10^{20}$ atoms per cubic centimeter.

14. The photodiode of claim 12, further comprising:
an n-type metal contact on a portion of said first electrode layer; and
a p-type metal contact on said second electrode layer.

15. The photodiode of claim 12, wherein said sapphire substrate has a thickness between 200 and 500 microns.

16. A back-illuminated heterojunction photodiode comprising:
a substrate;
a AlN layer formed above said substrate;
a first AlGaN layer formed above said AlN layer;
a second AlGaN layer formed above said first AlGaN layer; and a third AlGaN layer formed above said second AlGaN layer; wherein the Al fraction in the second AlGaN layer is less than the Al fraction in the first and third AlGaN layers.

17. The photodiode of claim 16, wherein:
light enters said substrate;
some of the light propagates through said first AlGaN layer; and
some of the light is absorbed by said second AlGaN layer.

18. The photodiode of claim 17, wherein:
said first AlGaN layer is n-type doped; and
said third AlGaN layer is p-type doped.

19. The photodiode of claim 18, wherein:
said AlN layer is a buffer layer;
said first AlGaN layer is an electrode layer; and
said third AlGaN layer is an electrode layer.

20. The photodiode of claim 19, wherein:
said first AlGaN layer comprises $Al_xGa_{(1-x)}N$;
said second AlGaN layer comprises $Al_yGa_{(1-y)}N$; and
said second AlGaN layer comprises $Al_zGa_{(1-z)}N$.

21. The photodiode of claim 20, wherein said substrate comprises sapphire.

22. A UV back-illuminated heterojunction photodiode comprising:
a substrate transparent to at least a portion of a desired light spectrum, the desired light spectrum having wavelengths below about 360 nm;
a first layer situated near said substrate, electrically conductive and at least substantially transparent to the portion of the light spectrum;
a second layer situated next to said first layer and significantly absorptive to the portion of the desired light spectrum; and
a third layer situated next to said second layer and electrically conductive.

23. The photodiode of claim 22, further comprising:
a first electrical contact formed on said first layer; and
a second electrical contact formed on said second layer.

24. The photodiode of claim 23, wherein:
said first layer is n-doped; and
said third layer is p-doped.

25. The photodiode of claim 24, wherein said second layer is undoped.

26. The photodiode of claim 25, wherein said first, second and third layers comprise AlGaN.

27. The photodiode of claim 26, further comprising a AlN layer situated between said substrate and said first layer.

28. The photodiode of claim 27, wherein the portion of the light spectrum is at least a portion of the ultraviolet light spectrum.

29. The photodiode of claim 28, wherein:
said first layer comprises $Al_xGa_{(1-x)}N$;
said second layer comprises $Al_yGa_{(1-y)}N$;
said third layer comprises $Al_zGa_{(1-z)}N$; and
$Z \geq x$.

30. The photodiode of claim 29, wherein x>y.

31. The photodiode of claim 30, wherein said substrate comprises sapphire.

32. A back-illuminated heterojunction photodiode having a backside and a frontside for detecting an incoming light beam, comprising:
a substrate adjacent the backside of the photodiode, the substrate being substantially transparent to at least a portion of a desired light spectrum of the incoming light beam, the desired light spectrum having wavelengths below about 360 nm;
an absorption layer positioned between the substrate and the frontside of the photo-diode, the absorption layer being significantly absorptive to the portion of the desired light spectrum; and
the portion of the back-illuminated photodiode that extends from the substrate to the absorption layer is substantially transparent to the portion of the desired light spectrum.

* * * * *